(12) United States Patent
Ito

(10) Patent No.: US 7,982,392 B2
(45) Date of Patent: Jul. 19, 2011

(54) ORGANIC ELECTROLUMINESCENT DISPLAY DEVICE

(75) Inventor: Masato Ito, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 232 days.

(21) Appl. No.: 11/876,816

(22) Filed: Oct. 23, 2007

(65) Prior Publication Data

US 2008/0100209 A1    May 1, 2008

(30) Foreign Application Priority Data

Oct. 25, 2006  (JP) ................................. 2006-289491

(51) Int. Cl.
*H01J 1/62* (2006.01)
*H05B 33/00* (2006.01)
*H01L 51/54* (2006.01)

(52) U.S. Cl. ........................................ 313/504; 313/506

(58) Field of Classification Search .................. 313/504, 313/506

See application file for complete search history.

(56) References Cited

U.S. PATENT DOCUMENTS

| | | | |
|---|---|---|---|
| 6,869,635 B2 | 3/2005 | Kobayashi | |
| 7,026,658 B2 * | 4/2006 | Park et al. | ........................ 257/98 |
| 7,116,044 B2 * | 10/2006 | Fukunaga | ..................... 313/498 |
| 7,393,600 B2 | 7/2008 | Inoue et al. | |
| 7,580,014 B2 | 8/2009 | Tanaka | |
| 2004/0252088 A1 | 12/2004 | Kawachi et al. | |
| 2005/0123751 A1* | 6/2005 | Tsutsui et al. | ................ 428/364 |

FOREIGN PATENT DOCUMENTS

| | | |
|---|---|---|
| JP | 09-063771 | 3/1997 |
| JP | 2004-127551 | 4/2004 |
| JP | 2004-139780 | 5/2004 |
| JP | 2005-19211 | 1/2005 |
| WO | WO 01/63975 | 8/2001 |

\* cited by examiner

*Primary Examiner* — Nimeshkumar D Patel
*Assistant Examiner* — Anthony T Perry
(74) *Attorney, Agent, or Firm* — Antonelli, Terry, Stout & Kraus, LLP.

(57) ABSTRACT

To provide an organic electroluminescent display device promoting a color purity of emitted light and promoting a contrast in a top emission type organic electroluminescent display device, there is constructed a constitution including a plurality of pixel electrodes CD arranged at a main face of an insulating substrate SUB, a plurality of organic electroluminescent layers OLE having a multi-layer structure respectively arranged above the plurality of pixel electrodes CD, a light transmitting opposed electrode AD arranged above the organic electroluminescent layer OLE, and a bank BMP arranged between respectives of the plurality of organic electroluminescent layers OLE and including an auxiliary electrode SD in a strip-like shape above the opposed electrode AD.

8 Claims, 11 Drawing Sheets

ORGANIC ELECTROLUMINESCENT DISPLAY DEVICE

CROSS-REFERENCE TO RELATED APPLICATIONS

The disclosure of Japanese Patent Application No. 2006-289491 filed on (2006 Oct. 25) including the claims, the specification, the drawings and the abstract is incorporated herein by reference in its entirely.

BACKGROUND

The present invention relates to an organic electroluminescent display device, particularly relates to an organic electroluminescent display device including a top emission type organic electroluminescent element.

DESCRIPTION OF RELATED ART

As a display device of a flat panel type, a liquid crystal display device (LCD), a plasma display device panel (PDP), a field emission type display device (FED), an organic electroluminescent display device (OLED) or the like is reduced into practice or brought into an application research stage. Among them, an organic electroluminescent display device is an extremely promising display device device as a display device in the future to constitute a typical example of a thinned/light-weighted emissive display device.

There are so-to-speak a bottom emission type and a top emission type in an organic electroluminescent display device. According to an organic electroluminescent display device of a bottom emission type, there is constituted an organic electroluminescent element by a light emitting mechanism successively laminated with a transparent electrode (ITO or the like) as a first electrode or one electrode, multi-layer organic films (also referred to as organic electroluminescent layer) for emitting light by applying an electric field, and a reflecting metal electrode as a second electrode or other electrode at a main face of an insulating substrate constituting a TFT substrate and preferably constituted by a glass substrate. A number of the organic electroluminescent elements are aligned in a matrix shape, other substrate or an encapsulating film referred to as an encapsulating can is provided to cover the structure of laminating these, and the light emitting structure is blocked from an external atmosphere. Further, for example, an anode is constituted by the transparent electrode, a cathode is constituted by the metal electrode and by applying an electric field between the both electrodes, a carrier (electron and hole) are injected into the organic multi-layer film and the organic multi-layer film emits light. There is constructed a constitution of emitting the emitted light from a side of the glass substrate to outside.

On the other hand, the top emission type organic electroluminescent display device is characterized by a constitution in which the one electrode is constituted by the reflecting metal electrode, the other electrode is constituted by the transparent electrode of ITO or the like, a light emitting layer emits light by applying an electric field between the two electrodes, and the emitted light is emitted from the side of the other electrode. The top emission type is characterized in that a top side of a driving circuit above the insulating substrate can also be utilized as a light emitting area. Further, according to the top emission type, as a constitution in correspondence with the encapsulating can in the bottom emission type, a transparent plate preferably constituted by a glass plate can be used.

With regard to an organic electroluminescent display device of this kind, the following Patent Reference 1 discloses a technology with regard to a surface treatment of a film suitable for an ink jet process in fabricating a top emission type organic electroluminescent display device element, and the following Patent Reference 2 discloses a technology in which a light emitting area comprising an organic light emitting layer formed on one electrode and other electrode arranged on a substrate is surrounded by a bank of an inorganic insulating film having a thin film thickness and a small taper, edge growth is eliminated by reducing a stepped difference of the bank, stray light from a contiguous pixel is prevented from being reflected and a bench stepping of the electrode is avoided, respectively.

[Patent Reference 1] JP-A-2004-127551

[Patent Reference 2] JP-A-2005-5227 (corresponding US Patent Publication No. 2004-252088)

SUMMARY

According to a top emission type organic electroluminescent display device, depending on an element constitution, a film thickness of an electrode or an organic electroluminescent layer, an influence of interference of light is considerable and it is difficult to promote a luminescence and a contrast.

A strictness of a film thickness control of the organic electroluminescent layer is requested in order to alleviate the influence of the interference of light. However, the request incorporates a problem contrary to shortening an operation time period and a reduction in fabrication cost in a fabrication procedure.

Further, in addition to the influence of the interference of light, a luminescence non-uniformity is brought about by a resistance of the light transmitting opposed electrode arranged at an upper portion, presence of the luminescence non-uniformity constitutes a considerable factor of hampering large-sized formation of the apparatus and a countermeasure thereagainst has been requested.

Further, there poses a problem that the influence of the interference of light makes prevention of reflection difficult and a polarizer is needed to be arranged separately.

Furthermore, by the influence of interference of light, in the constitution of multi-color light emittance, there also poses a problem that a color purity of each emitted light is low and a color reproducibility is not sufficient.

It is an object of the invention to provide an organic electroluminescent display device resolving the above-described problems having a high luminescence, a high contrast and an excellent color purity.

In order to achieve the above-described object, the invention is constructed by a constitution including a light transmitting opposed electrode extended above an insulating projection (hereinafter, refer to as bank) in a shape of a groin for separating respectives of organic electroluminescent layers contiguous to each other from above the organic electroluminescent layer and including an auxiliary electrode above the opposed electrode above the extended portion. Further, the invention provides the auxiliary electrode with a light absorbing function.

By constructing the invention by the constitution of including the auxiliary electrode above the opposed electrode above the bank, (1) a resistance value of the opposed electrode can be reduced by the auxiliary electrode and the non-uniformity in the luminance can be resolved. (2) Reflection of external light and generated (emitted) light can be reduced, color purities and luminances of respectives of generated light can be promoted and a contrast can be promoted. (3) Unnecessary emitted light can be shielded, and therefore, rates of emitting blue, green, red components of light are increased and color purities of respectives of RGB of emitted light are promoted. (4) Color interference of light can be reduced, and therefore, a polarizer is not made to be indispensable separately but can be omitted and not only cost is reduced but also a luminance can be expected to promote. (5) A color reproducing range as a full color organic electroluminescent display device is enlarged. (6) The apparatus is thinned and further light-weighted, and therefore, an applicable product range can be enlarged.

DETAILED DESCRIPTION OF THE INVENTION

Embodiments of the invention will be explained in details in reference to the drawings of examples as follows.

Example 1

Figure 1:
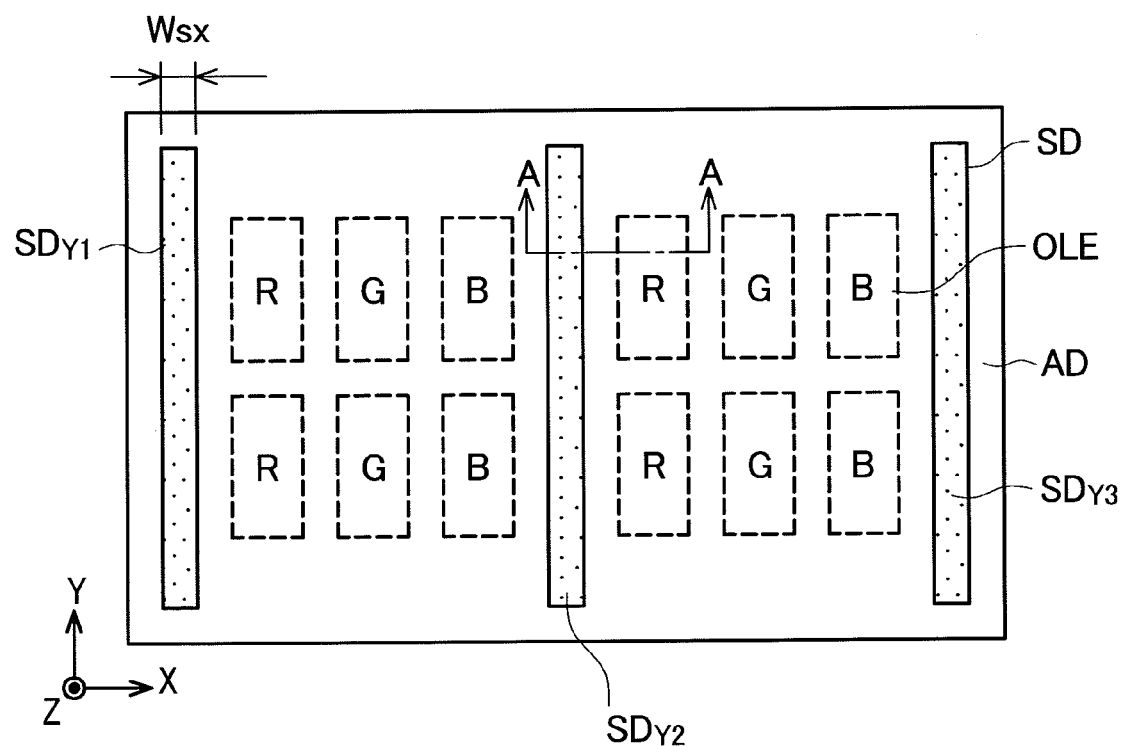
FIG. 1 is a schematic plane sectional view for explaining an outline structure of an embodiment of an organic electroluminescent display device according to the invention.
Figure 2:
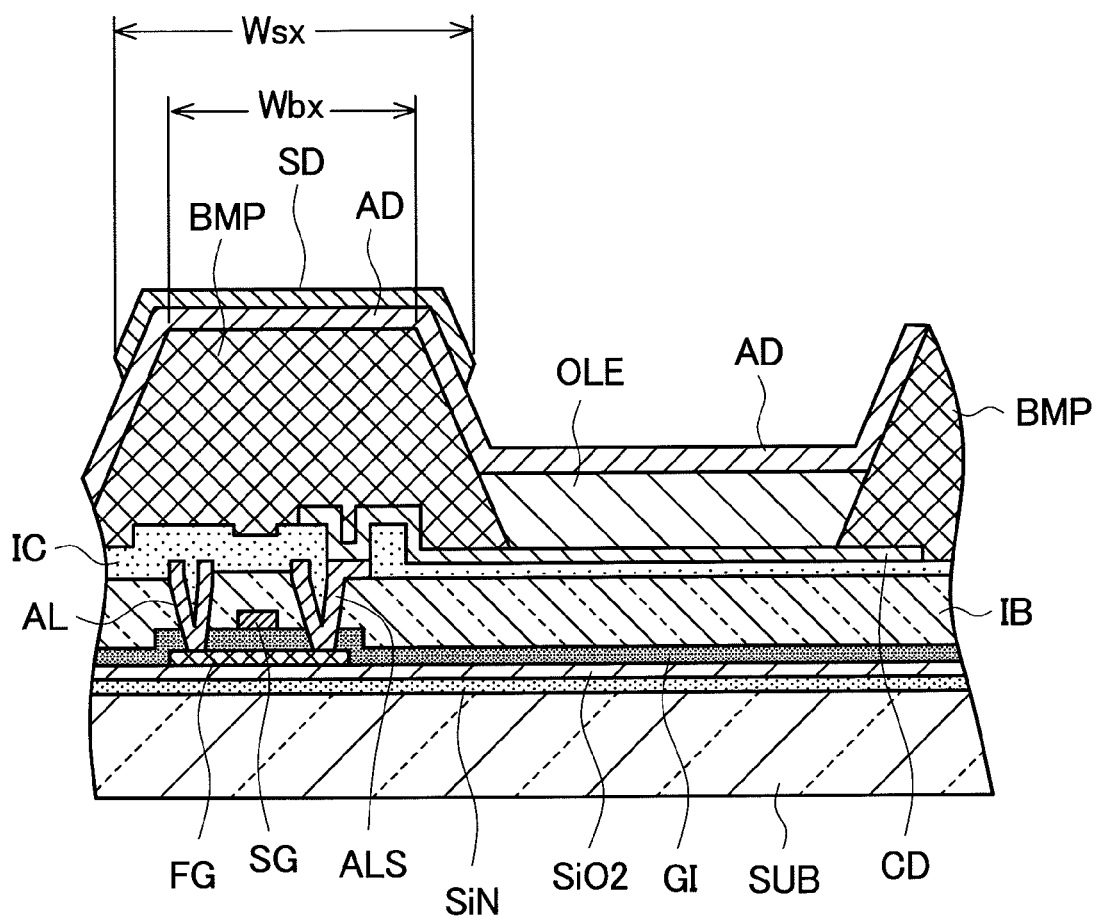
FIG. 2 is an enlarged sectional view taken along a line A-A of FIG. 1.
Figure 3:
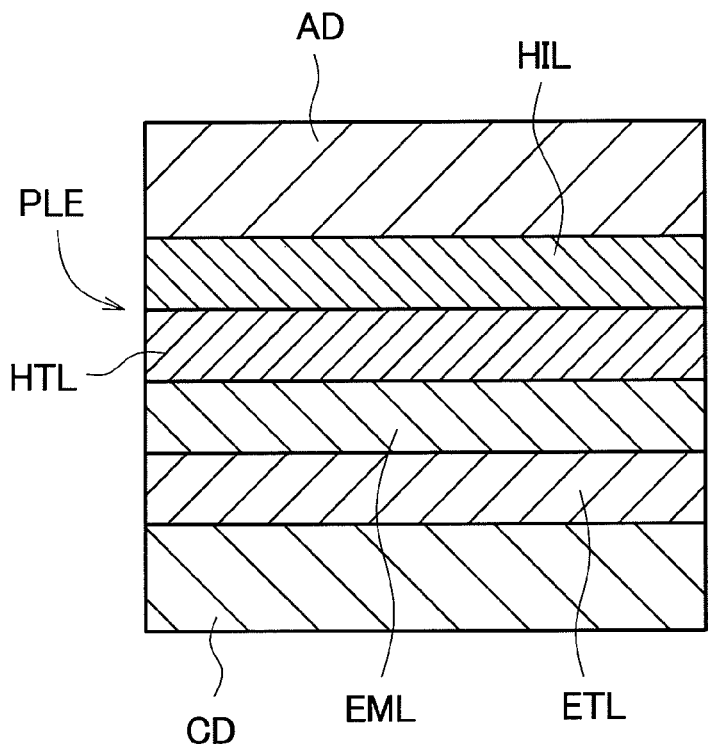
FIG. 3 is a sectional view enlarging an essential portion of FIG. 2.

FIG. 1 through FIG. 3 are schematic views for explaining an outline structure of an example of an organic electroluminescent display device of the invention, FIG. 1 is a plane view, FIG. 2 is an enlarged sectional view taken along a line A-A of FIG. 1, and FIG. 3 is a sectional view enlarging an organic electroluminescent layer of FIG. 2. In FIG. 1 through FIG. 3, reference notation AD designates an opposed electrode (anode electrode), notation CD designates a pixel electrode (cathode electrode), notation BMP designates a bank, notation OLE designates an organic electroluminescent layer, notation IB designates an insulating flattening film, notation IC designates an insulating film, notation FG designates a first gate, notation SG designates a second gate, notation GI designates a gate insulating film, notation AL designates a wiring between switching elements, notation ALS designates a wiring between switching elements (a portion serving also as a light shield), and notation SUB designates an insulating substrate.

The insulating substrate SUB is a substrate preferably constituted by transparent glass formed with silicon nitride SiN, silicon oxide $SiO_2$ at a main face thereof to constitute the above-described TFT substrate. The first gate FG is formed at a switching element region on the film of silicon oxide $SiO_2$ by patterning a semiconductor film. The gate insulating film GI is formed to cover the first gate FG, the second gate SG is patterned on the gate insulating film GI, and the insulating flattening film IB is formed to cover thereon.

The wiring AL indicates a wiring between switching elements constituting a drain electrode of the switching element (a wiring between switches, a signal wiring, a drain wiring) to constitute drain electrode of the switching elements, further, the wiring ALS indicates a source electrode and a wiring and shield member between switching elements (a wiring and shield member between switches serving also as a shield member) and is connected to the first gate FG through a contact hole penetrating the flattening film IB and the gate insulating film GI. The insulating film IC is formed to cover the wiring between switches AL and the wiring and shield member between switches ALS. The pixel electrode CD in a flat plate shape connected to the wiring between switches and shield member ALS through the contact hole provided at the insulating film IC. Here, the pixel electrode CD is the cathode electrode.

The pixel electrode CD is constituted by, for example, an Mg—Ag alloy and is arranged in a shape of a matrix. The organic electroluminescent layer OLE constituting a light emitting area is arranged to laminate on the pixel electrode CD by being surrounded by the insulating projection (hereinafter, referred to as bank) BMP in a shape of a groin. The organic electroluminescent layer OLE is arranged in a shape of a matrix having a constitution of aligning RGB as one unit (pixel) in X direction and vertically aligning the same color in Y direction.

The bank BMP is constituted by an inorganic insulating material of, for example, a silicon oxide film, a silicon nitride film or the like and is constituted by a shape having an opening portion (bank opening) at the light emitting area. Therefore, the bank BMP is constituted by a shape having a recess at the opening portion. In this way, according to the organic electroluminescent display device of the example, the light emitting areas of the organic electroluminescent layers OLE of the pixels contiguous to each other are separated by the bank BMP comprising, for example, an inorganic insulating film.

The light transmitting opposed electrode AD comprising, for example, an ITO film is arranged on the organic electroluminescent layer OLE constituting the light emitting area. Here, the opposed electrode AD is an anode electrode. The opposed electrode AD is extended continuously to a side of the bank BMP on the organic electroluminescent layer OLE and is arranged by continuously cover a top face from a side wall of the bank BMP.

Further, a portion of a portion on the opposed electrode AD excluding the light emitting area is laminated to arrange with an auxiliary electrode SD including a conductive material such as Al, Ag by a predetermined pattern. The auxiliary electrode SD and the opposed electrode AD are conducted and the auxiliary electrode SD is provided with a function as an auxiliary wiring of the opposed electrode AD. That is, according to the example, as the auxiliary electrode SD, auxiliary electrodes SDy1 through SDy3 in a strip-like shape are arranged to be laminated on the opposed electrode AD at positions in correspondence with the bank BMP between pixels and concentric with the bank BMP. Further, end portions in longitudinal directions of the auxiliary electrodes SDy1 through SDy3 are connected to a power source circuit, not illustrated. A width Wsx in X direction (width direction) of the auxiliary electrode SD is formed to be wider than a width Wbx in the same direction of the top face of the bank BMP. On the other hand, the auxiliary electrodes are constructed by a constitution continuous in Y direction (longitudinal direction) in a strip-like shape. In forming the auxiliary electrode SD, a technology well-known in a background art of a photolithography technology or the like can be utilized. When the opposed electrode AD is operated, the auxiliary electrode SD is operated as a portion of the electrode to contribute to resolve a non-uniformity in a luminance of a display screen.

By making the width Wsx of the auxiliary electrode SD wider than the width Wbx of the top face of the bank BMP, there is provided a characteristic capable of controlling a light emitting amount of an entire face of the screen by controlling the light emitting area and capable of increasing a capacity of conducting electricity to the auxiliary electrode SD. When the auxiliary electrode SD is arranged by maximally utilizing an arrangeable space, the function as an auxiliary wiring can effectively and fully utilized.

Further, when the auxiliary electrode SD is formed by a conductive film having a light absorption function, an effect of promoting a contrast or the like can be expected similar to a black matrix (BM) film in a general display device.

Next, FIG. 3 shows details of an example of the organic electroluminescent layer OLE arranged at inside of the bank opening of the bank BMP. The organic electroluminescent layer OLE shown in FIG. 3 is arranged with an electron transport layer ETL to be brought into contact with the pixel electrode CD, a light emitting layer EML, a hole transport layer HTL, and a hole injection layer HIL are successively and respectively laminated thereabove, and the topmost layer is arranged with the opposed electrode AD over an entire face thereof. The organic electroluminescent layer OLE is formed to be brought into contact with an inner edge of the bank opening.

In the above-described constitution, the transparent opposed electrode AD functions as an anode, the pixel electrode CD functions as the cathode, a transparent electrode material having a high work function may be used for the transparent electrode AD constituting the anode and although ITO mentioned above is general therefor, other transparent conductive substance may be used therefor. Al, Mg, an MG/Ag alloy or an Al/Li alloy or the like having a low work function can be used for the pixel electrode CD constituting the cathode. Further, in order to promote a property, not a single substance of Al but an alkaline metal compound of extremely thin lithium fluoride (LiF) or the like may be used between Al and an organic layer. Further, it is preferable to constitute the pixel electrode CD by a material having a low reflectance of light in order to restrain reflection of light emitted from the light emitting layer.

The light emitting layer EML uses a material for emitting light by a desired color when a predetermined voltage is applied between the transparent opposed electrode AD constituting the anode and the pixel electrode CD constituting the cathode.

As a material of the light emitting layer EML, for emitting red color light, for example, the light emitting layer can use Alq3 (tris (8-quinolinolate) aluminum) dispersed with DCM-1 (4-(dicyanomethylene)-2-methyl-6-(p-dimethylaminostyryl)-4 H-pyran), for emitting green color light, the light emitting layer can use, for example, Alq3, Bebq, Alq3 doped by quinacridone, for emitting blue color, the light emitting layer can use, for example, DPVBi (4,4'-bis(2,2-diphenylvinyl) biphenyl), or a material comprising DPVBi and BCzVBi (4,4'-bis (2-carbazole vinylene) biphenyl), or a material doped by constituting a host by distyrylallylene derivative and constituting a guest by distyrylamine derivative.

Further, in each of the light emitting layer EML, the hole injection layer HIL can use CuPc (copper phthalocyanine), the hole transport layer HTL can use α-NPD (N,N'-di (α-naphtyl)-N,N'-diphenyl 1,1'-biphenyl-4,4'-diamine) or triphenyldiamine delivative TPD (N,N'-bis(3-methyl phenyl) 1,1'-biphenyl-4,4'-diamine), and the electron transport layer ETL can use Alq3. Further, other than the above-described material of low molecular species, a material of polymer species can also be used.

According to an organic electroluminescent element having the organic electroluminescent layer OLE of the constitution, when a direct current power source is connected between the opposed electrode AD constituting the anode and the pixel electrode CD constituting the cathode and a direct current voltage is applied between the two electrodes, holes injected from the opposed electrode AD and electrons injected from the pixel electrode CD respectively reach the light emitting layer, recombination of electron-hole is brought about and light emittance of a predetermined wave length is produced.

Figure 4:
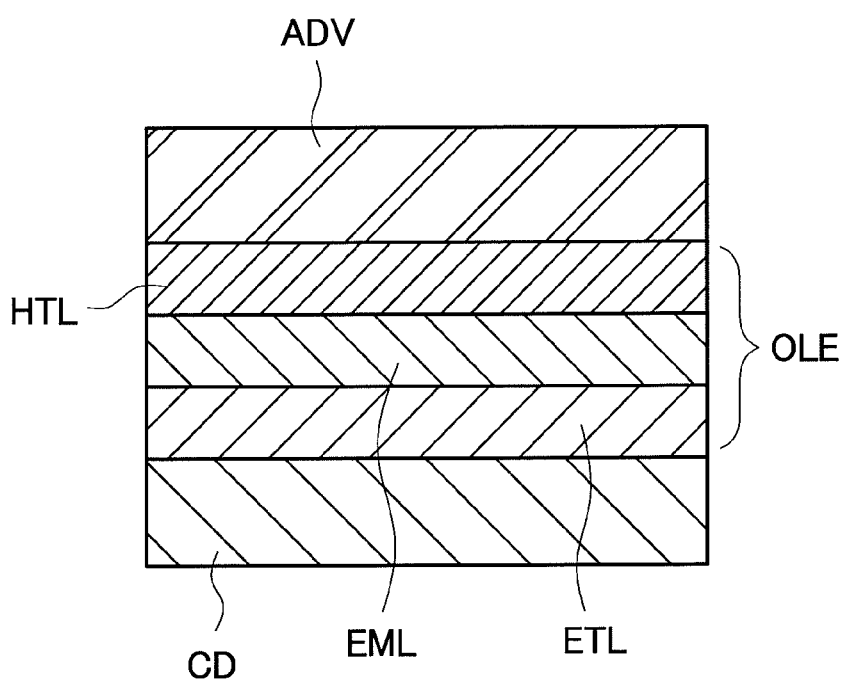
FIG. 4 is a sectional view enlarging an essential portion for explaining other example of an organic electroluminescent layer used in an organic electroluminescent display device according to the invention.
Figure 5:
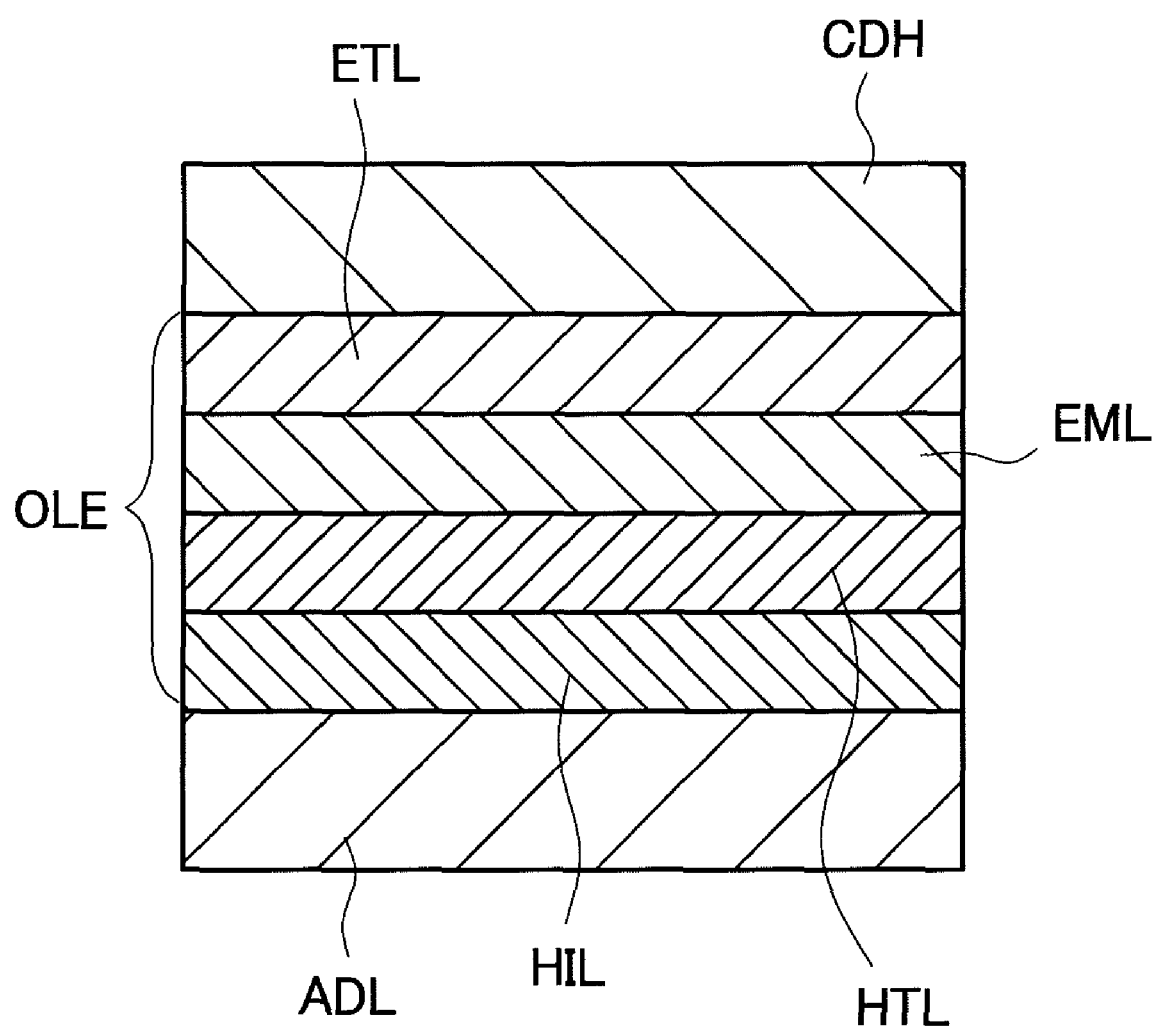
FIG. 5 is a sectional view enlarging an essential portion for explaining still other example of an organic electroluminescent layer used in an organic electroluminescent display device according to the invention.

FIG. 4 and FIG. 5 are enlarged sectional views for explaining other constitution examples of the organic electroluminescent layer of the organic electroluminescent display device according to the invention, portions the same as those of the above-described drawings are attached with the same notations.

First, in FIG. 4, the organic electroluminescent layer OLE is constructed by a constitution of a 3 layer structure of the electron transport layer ETL and the light emitting layer EML and the hole transport layer HTL laminated with an opposed electrode ADV comprising $V_2O_5$ member. Other constitutions are the same as those of FIG. 1 and FIG. 2.

Next, in FIG. 5, the organic electroluminescent layer OLE is respectively arranged with a pixel electrode ADL constituting an anode electrode on a back face side and an opposed electrode CDH having a semitransparent property constituting a cathode electrode on a front face side and successively laminated with the hole injection layer HIL, the hole transport layer HTL, the light emitting layer EML and the electron transport layer ETL from a side of the pixel electrode ADL.

Example 2

Figure 6:
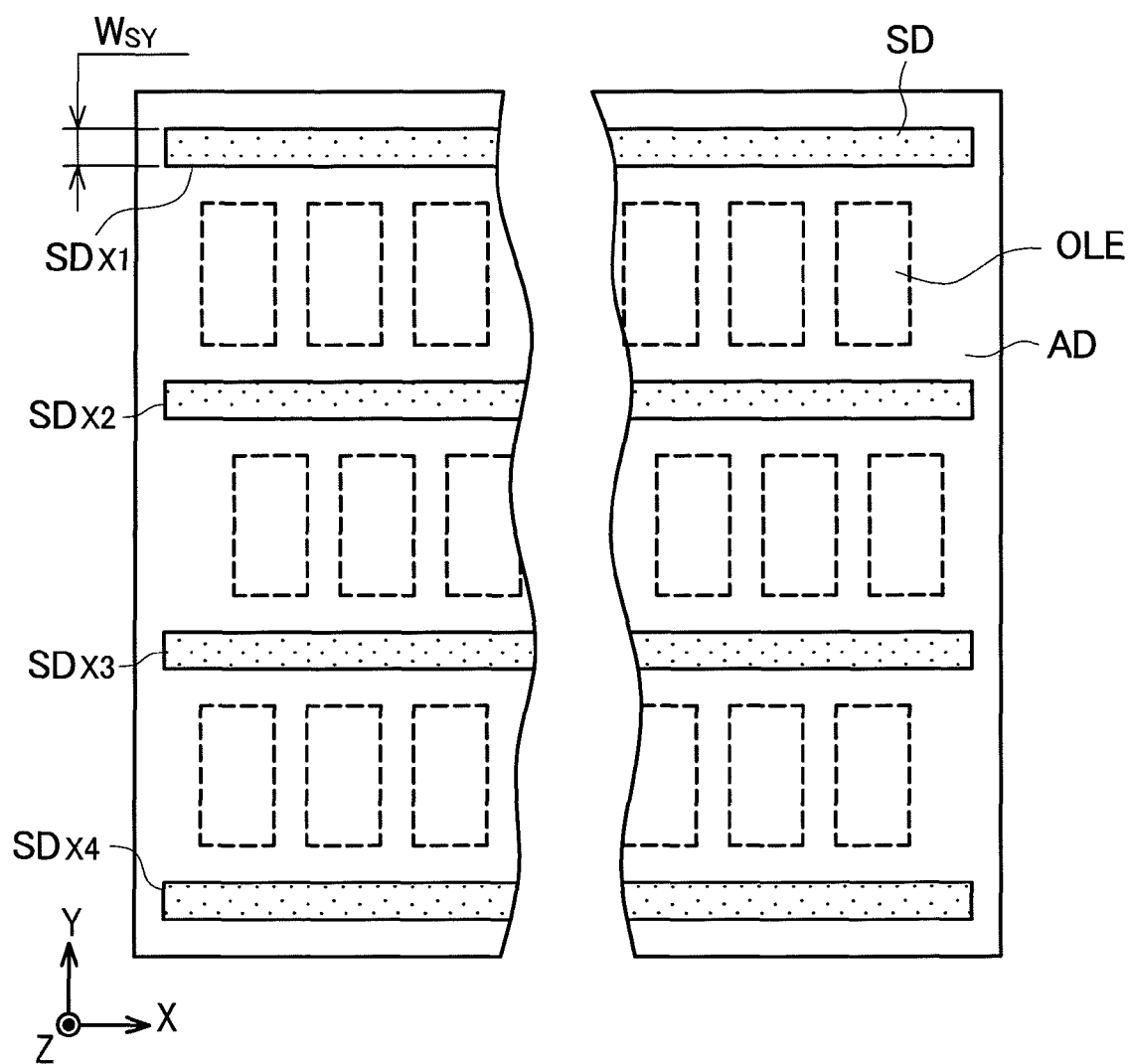
FIG. 6 is a schematic plane view for explaining an auxiliary electrode aligning pattern of still other example of an organic electroluminescent display device according to the invention.

FIG. 6 is a schematic plane view for explaining an auxiliary electrode aligning pattern of still other example of the organic electroluminescent display device according to the invention and portions the same as those of the above-described drawings are attached with the same notations. In FIG. 6, there is constructed a constitution in which auxiliary electrodes SD (SDx1 through SDx4) in a strip-like shape are arranged on the bank BMP dividing the organic electroluminescent layers OLE in Y direction and continuously extended in X direction by way of the opposed electrode AD. A relationship between a width Wsy in the Y direction (width direction) of the auxiliary electrode SD and a width of a top face in the same direction of the bank BMP is brought into a relationship the same as that of Example 1 in which the width Wsy in Y direction of the auxiliary electrode SD is larger than a width of the top face of the bank BMP. There is constructed a constitution of arranging the auxiliary electrode SD to extend in X direction between respective pixels. Also the auxiliary electrode SD is connected to a power source circuit, not illustrated.

Example 3

Figure 7:
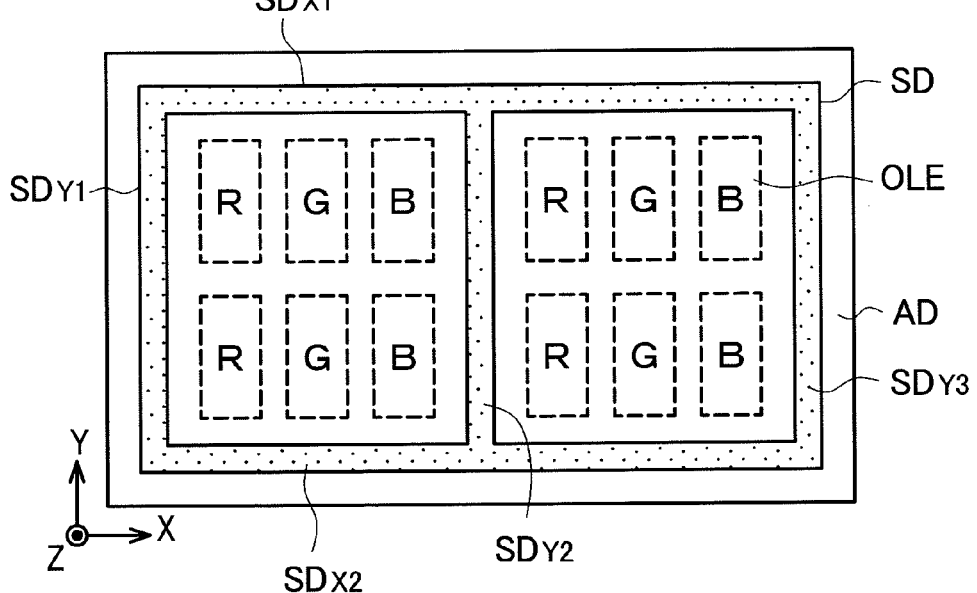
FIG. 7 is a schematic plane view for explaining an auxiliary electrode aligning pattern of still other embodiment of an organic electroluminescent display device according to the invention.

FIG. 7 is a schematic plane view for explaining an auxiliary electrode aligning pattern of still other example of the organic electroluminescent display device according to the invention, and portions the same as those of the above-described drawings are attached with the same notations. According to Example 3 shown in FIG. 7, there is constructed a constitution in which the pattern of arranging the auxiliary electrodes SDy1 through SDy3 shown in FIG. 1 are additionally arranged with the auxiliary electrodes SDx1, SDx2 extended in X direction at upper and lower ends of the screen, and the organic electroluminescent layer OLE is surrounded by the auxiliary electrodes SD. By aligning the auxiliary electrodes SD, the connection to the power source circuit described above becomes simple and convenient.

Example 4

Figure 8:
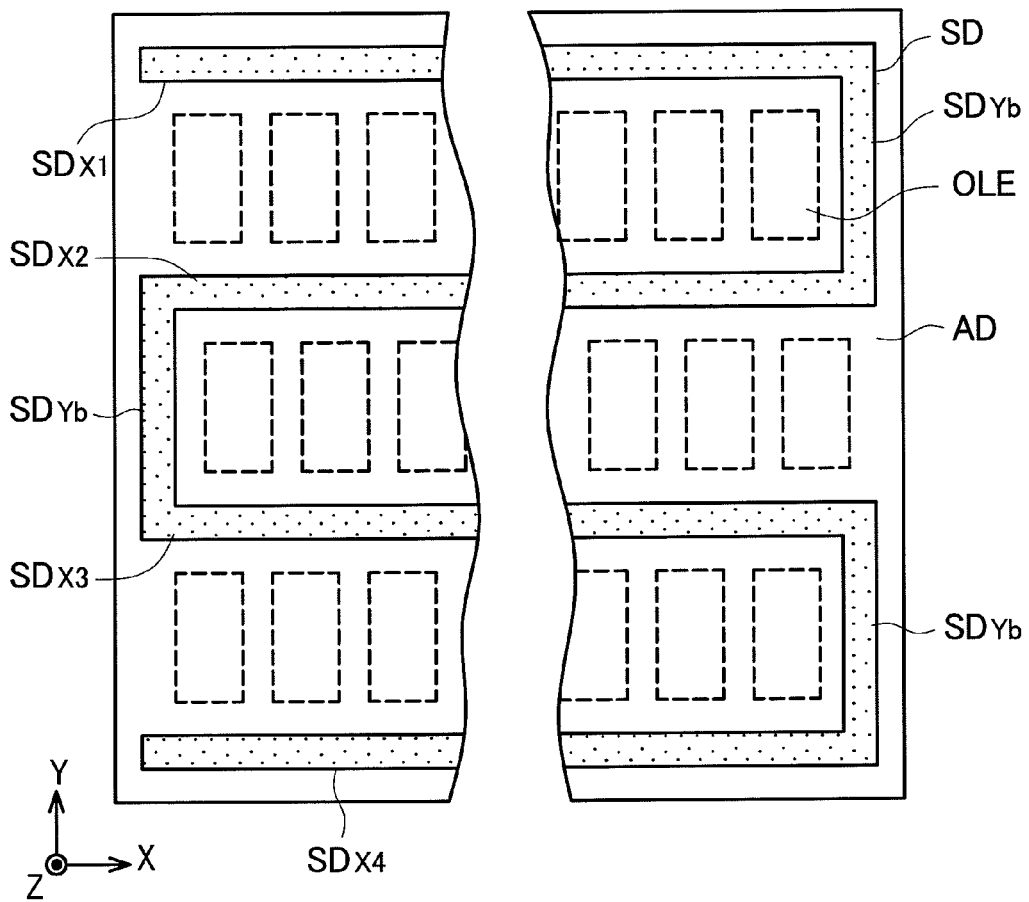
FIG. 8 is a schematic plane view for explaining an auxiliary electrode aligning pattern of still other embodiment of an organic electroluminescent display device according to the invention.

FIG. 8 is a schematic plane view for explaining an auxiliary electrode aligning pattern of still other example of the organic electroluminescent display device according to the invention, and portions the same as those of the above-described drawings are attached with the same notations. In Example 4 shown in FIG. 8, the pattern of arranging the auxiliary electrodes SDx1 through SDx4 shown in FIG. 6 is arranged with auxiliary electrodes SDyb extended in Y direction at left and right ends of the screen for connecting the auxiliary electrodes SDx1 through SDx4, and the auxiliary electrodes SDx1 through SDx4 are connected in series with each other. By aligning the auxiliary electrodes SD, the connection to the power source circuit becomes simple and convenient similar to Example 3 mentioned above.

Example 5

Figure 9:
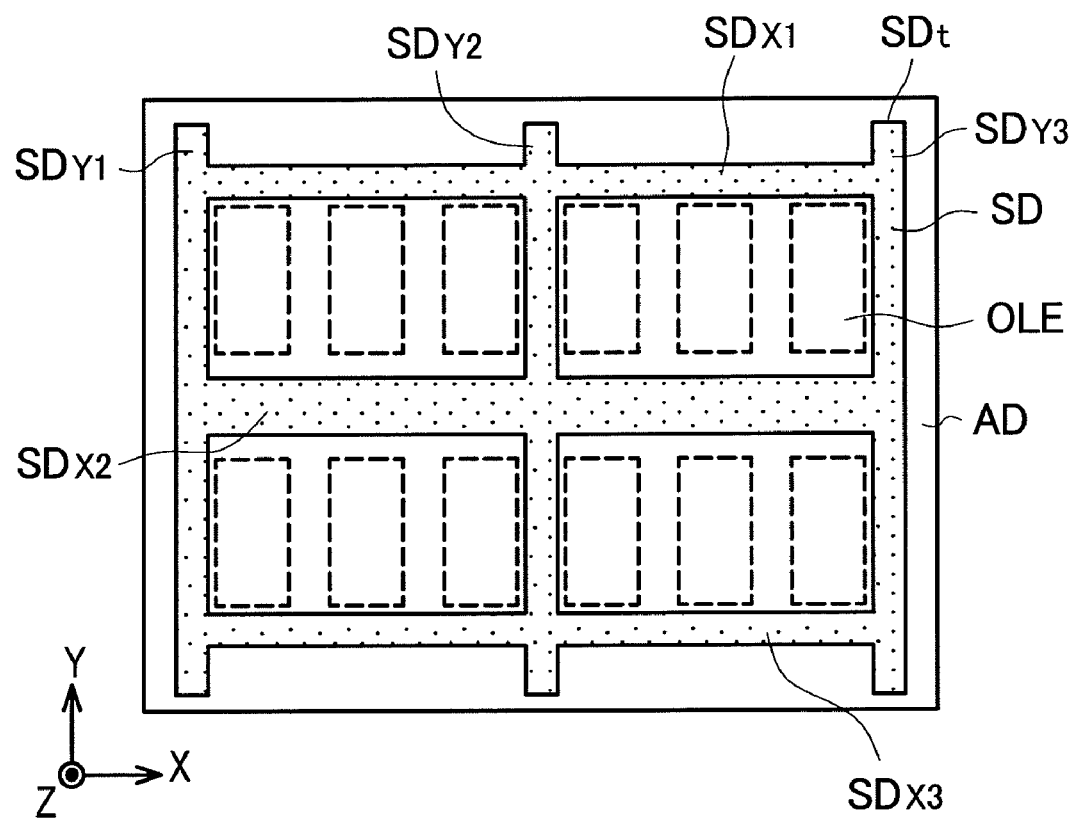
FIG. 9 is a schematic plane view for explaining an auxiliary electrode aligning pattern of still other embodiment of an organic electroluminescent display device according to the invention.

FIG. 9 is a schematic plane view for explaining an auxiliary electrode aligning pattern of still other example of the organic electroluminescent display device according to the invention, and portions the same as those of the above-described drawings are attached with the same notations. In Example 5 shown in FIG. 9, a dimension of the auxiliary electrode SD is made to be variable in line with a dimension of the bank BMP, and there is constructed a constitution in which a width of the auxiliary electrode SDx2 arranged at a center portion of the screen is made to be wider than those of the auxiliary electrodes SDx1, SDx3 arranged at upper and lower ends. Further, Example 5 is arranged with a projected portion SDt capable of being utilized as a connection terminal at an end portion of the auxiliary electrode SD. In this way, when an area of the auxiliary electrode SD becomes large, an electricity conducting capacity becomes large in the same film thickness and an auxiliary current can be increased.

Example 6

Figure 10:
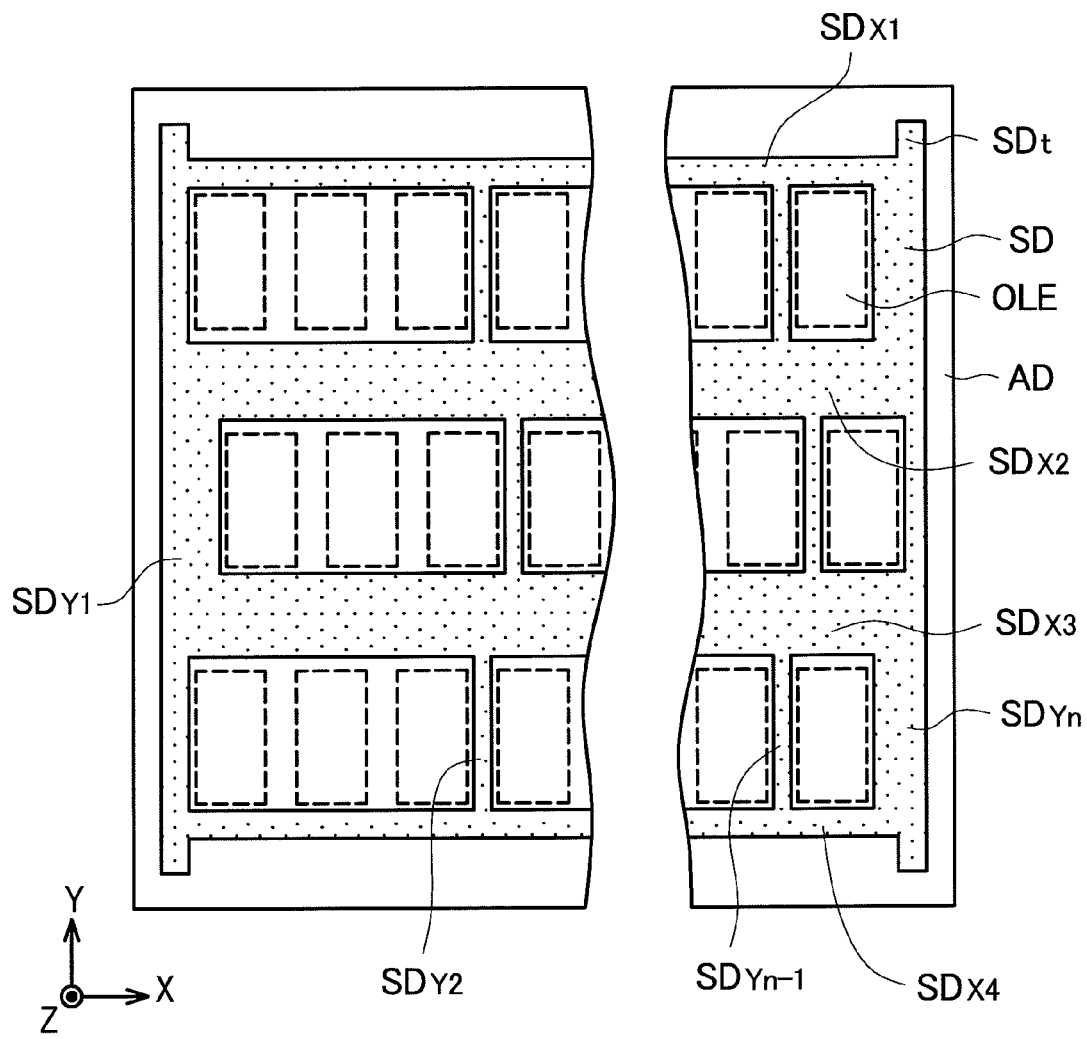
FIG. 10 is a schematic plane view for explaining an auxiliary electrode aligning pattern of still other embodiment of an organic electroluminescent display device according to the invention.

FIG. 10 is a schematic plane view for explaining an auxiliary electrode aligning pattern of still other example of the organic electroluminescent display device according to the invention, and portions the same as those of the above-described drawings are attached with the same notations. In Example 6 shown in FIG. 10, the dimension of the auxiliary electrode SD is made to be variable in line with the dimension of the bank BMP similar to Example 5 mentioned above. In FIG. 10, there is constructed a constitution in which large or small is present in film widths of auxiliary electrodes SDy1 and SDyn arranged at left and right ends of the screen, and the auxiliary electrodes SDy2 and SDyn−1 arranged for respective pixels are constituted by the same width. On the other hand, the auxiliary electrodes SDx1 through SDx4 extended in X direction are constructed by a constitution in which widths of the auxiliary electrodes SDx2, SDx3 arranged at a middle are made to be wider than those of the auxiliary electrodes SDx1, SDx4 arranged at upper and lower ends.

Example 7

Figure 11:
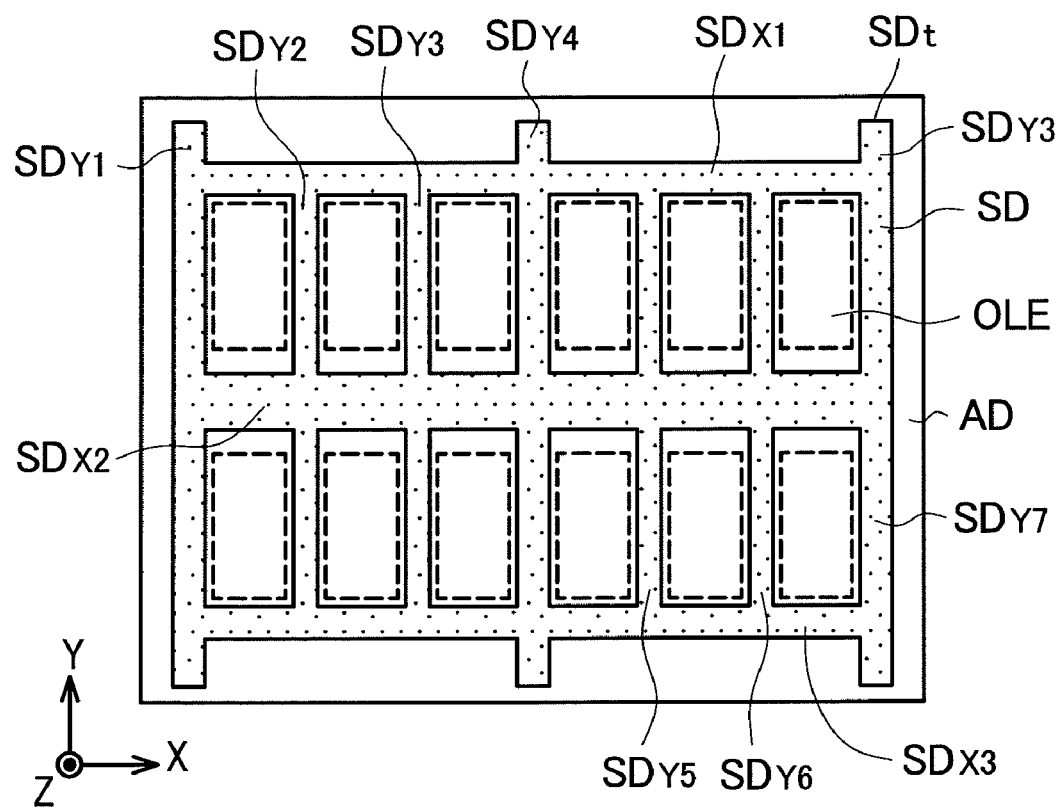
FIG. 11 is a schematic plane view for explaining an auxiliary electrode aligning pattern of still other embodiment of an organic electroluminescent display device according to the invention.

FIG. 11 is a schematic plane view for explaining an auxiliary electrode aligning pattern of still other example of the organic electroluminescent display device according to the invention, and portions the same as those of the above-described drawings are attached with the same notations. According to Example 7 shown in FIG. 11, there is constructed a constitution in which the auxiliary electrodes SD are arranged in correspondence with all of the banks BMP and the dimension of the auxiliary electrode SD is made to be variable in line with the dimension of the bank BMP. In FIG. 11, there is constructed a constitution in which widths of the auxiliary electrodes SDy1 through SDy7 and SDx1, SDx4 are the same and only a width of the auxiliary electrode SDx2 extended in X direction at a center portion of the screen is made to be wider than those of the others. By arranging the auxiliary electrodes SD in correspondence with all the banks BMP as in Example 7, a highly fine and high contrast display device can further be carried out.

Example 8

Figure 12:
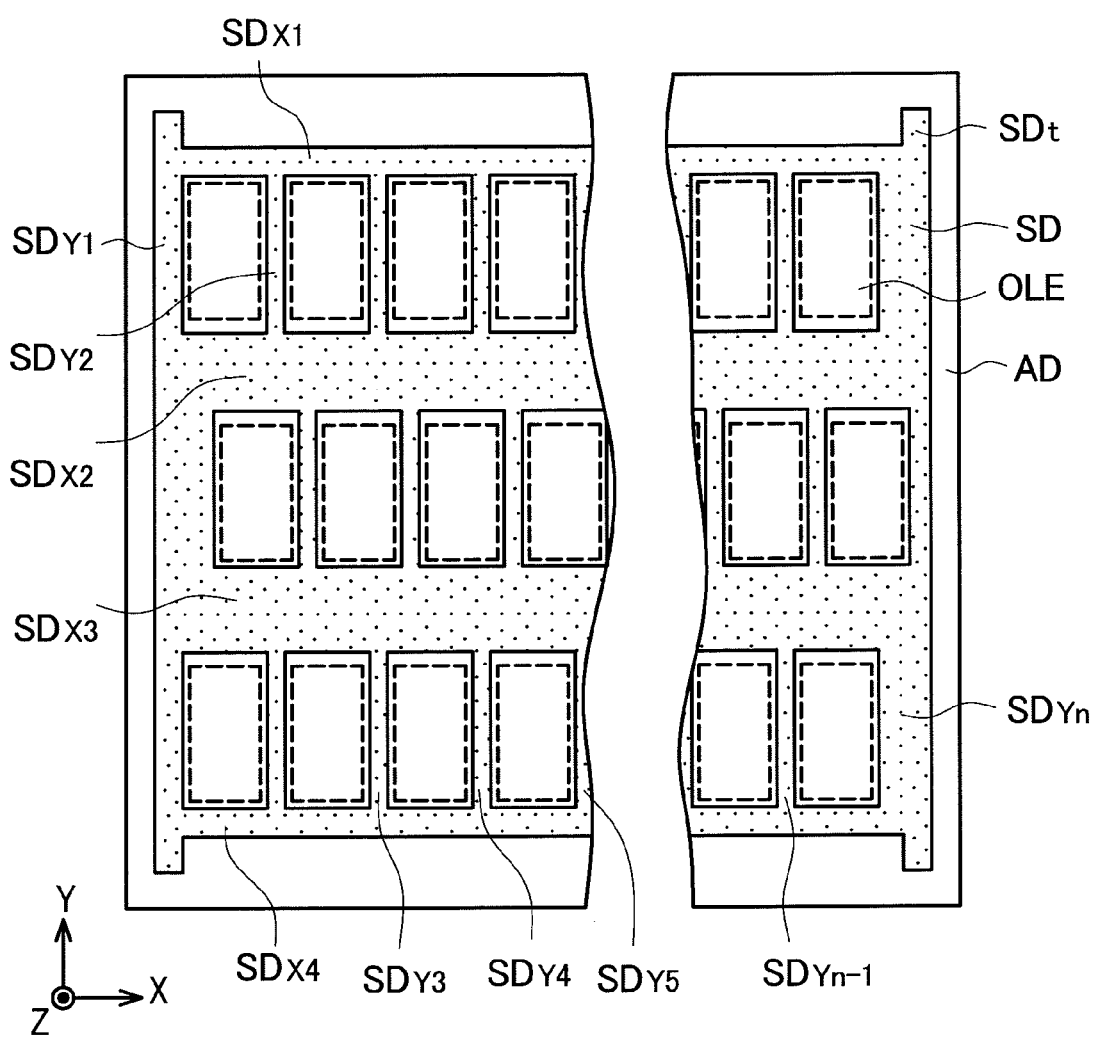
FIG. 12 is a schematic plane view for explaining an auxiliary electrode aligning pattern of still other embodiment of an organic electroluminescent display device according to the invention.

FIG. 12 is a schematic plane view for explaining an auxiliary electrode aligning pattern of still other example of the organic electroluminescent display device according to the invention, and portions the same as those of the above-described drawings are attached with the same notations. In Example 8 shown in FIG. 12, there is constructed a constitution in which the auxiliary electrodes SD are arranged in correspondence with all the banks BMP similar to Example 7 and the dimension of the auxiliary electrode SD is made to be variable in line with the dimension of the bank BMP. In FIG. 12, widths of the auxiliary electrodes SDy2 through SDyn−1 and SDx1, SDx3 are the same and large or small is present in film widths of the auxiliary electrodes SDy1 and SDyn extended in Y direction on left and right of the screen, further, there is constructed a constitution in which widths of the auxiliary electrodes SDx2, SDx3 extended in X direction at a center portion of the screen are made to be wider than those of the others.

Example 8 is provided with a characteristic similar to that of Example 7 mentioned above.

Example 9

Figure 13:
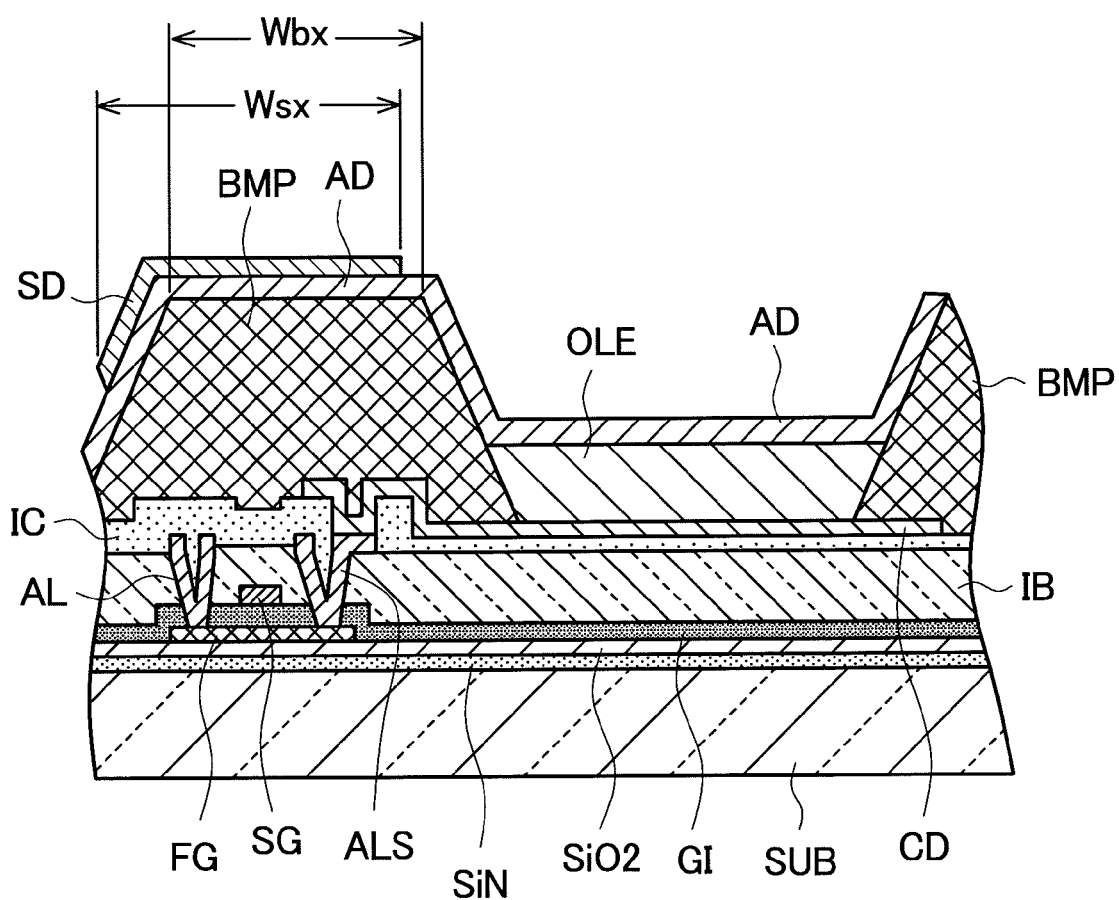
FIG. 13 is a schematic sectional view for explaining an outline structure of still other embodiment of an organic electroluminescent display device according to the invention.

FIG. 13 is a schematic sectional view in correspondence with FIG. 2 for explaining an outline structure of still other example of the organic electroluminescent display device of the invention, and portions the same as those of the above-described drawings are attached with the same notations. In Example 9 shown in FIG. 13, there is constructed a constitution in which a width Wsx in X direction of the auxiliary electrode SD is formed to be wider than the width Wbx in the same direction of the top face of the bank BMP, and the center in X direction of the auxiliary electrode SD is displaced from the center of the bank BMP in an outer side direction. According to the constitution, there is constructed a constitution of enlarging the light emitting area by displacing an inner side end portion of the auxiliary electrode SD to the outer side and an efficiency of utilizing emitted light is promoted. Here, the above-described auxiliary electrode SD is provided with a function as an auxiliary wiring of the opposed electrode AD as well as a function of a black matrix for making a contour of the light emitting area clear by providing a light absorbing function on an outer face side of the auxiliary electrode SD to contribute to promote a contrast by also reducing reflection of external light.

The invention claimed is:

1. An organic electroluminescent display device having a plurality of pixel electrodes arranged at a main face of an insulating substrate, organic electroluminescent layers having a multi-layer structure respectively arranged above the plurality of pixel electrodes, a light transmitting opposed electrode arranged at an upper layer of the organic electroluminescent layer, and an insulating projection having a top surface and at least one sidewall extending at an angle with respect to the top surface arranged between respectives of the plurality of organic electroluminescent layers and including an organic electroluminescent display device element having a constitution of emitting light from a side of the opposed electrode;

wherein an auxiliary electrode is extended on the opposed electrode along the insulating projection so as to cover at least a portion of the top surface of the insulating projection and to extend along and cover a portion of the at least one sidewall of the insulating projection at an angle corresponding to the extension angle of the at least one sidewall of the insulating projection and brought into contact with an upper portion of the opposed electrode; and wherein a width of the auxiliary electrode which extends along at least the portion of the top surface of the insulating projection from at least the covered portion of the at least one sidewall of the insulating projection is wider in at least one direction than a width of the top surface of the insulating projection in the at least one direction and is narrower than a greatest width of the entirety of the insulating projection in the at least one direction.

2. The organic electroluminescent display device according to claim 1, wherein the auxiliary electrode is constructed by a constitution of being arranged substantially concentric with the insulating projection.

3. The organic electroluminescent display device according to claim 1, wherein the auxiliary electrode is constructed by a constitution of including a light absorbing function.

4. The organic electroluminescent display device according to claim 1, wherein the organic electroluminescent layer is constructed by a constitution of including an electron transport layer, a light emitting layer, a hole transport layer and a hole injection layer.

5. The organic electroluminescent display device according to claim 1, wherein the opposed electrode is constituted by $V_2O_5$.

6. The organic electroluminescent display device according to claim 5, wherein the organic electroluminescent layer is constructed by a constitution of including an electron transport layer, a light emitting layer, and a hole transport layer.

7. The organic electroluminescent display device according to claim 1, wherein the width of the auxiliary electrode with respect to the width of the top portion and the entirety of the insulating projection enables control of a light emitting amount of the organic electroluminescent display device and enables increase of a capacity of conducting electricity to the auxiliary electrode.

8. The organic electroluminescent display device according to claim 1, wherein the opposed electrode extends along the insulating projection so as to cover the top surface and the at least one sidewall of the insulating projection, and the auxiliary electrode extends along and covers at least a portion of the opposed electrode covering at least the covered portion of the top surface and the covered portion of the at least one sidewall of the insulating projection as covered by the auxiliary electrode.

* * * * *